(12) United States Patent
Bauer et al.

(10) Patent No.: US 8,017,438 B2
(45) Date of Patent: Sep. 13, 2011

(54) SEMICONDUCTOR MODULE WITH AT LEAST TWO SUBSTRATES

(75) Inventors: Michael Bauer, Nittendorf (DE); Angela Kessler, Regensburg (DE); Wolfgang Schober, Amberg (DE); Alfred Haimerl, Sinzing (DE); Joachim Mahler, Regensburg (DE)

(73) Assignee: Infineon Technologies AG, Munich (DE)

( * ) Notice: Subject to any disclaimer, the term of this patent is extended or adjusted under 35 U.S.C. 154(b) by 1079 days.

(21) Appl. No.: 11/612,758

(22) Filed: Dec. 19, 2006

(65) Prior Publication Data
US 2008/0122075 A1 May 29, 2008

(30) Foreign Application Priority Data
Nov. 29, 2006 (DE) .......................... 10 2006 056 363

(51) Int. Cl.
*H01L 21/00* (2006.01)
(52) U.S. Cl. ................. 438/109; 438/123; 257/E21.001
(58) Field of Classification Search .................. 257/666, 257/E23.031, 677, 685, E21.001; 438/107, 438/110, 112, 106, 612, 614, 617, 666, 123, 438/109
See application file for complete search history.

(56) References Cited

U.S. PATENT DOCUMENTS

| 5,040,994 | A | * | 8/1991 | Nakamoto et al. | ........... 439/76.1 |
| 5,157,588 | A | * | 10/1992 | Kim et al. | ...................... 386/274 |
| 5,299,097 | A | * | 3/1994 | Kondo et al. | ................. 361/813 |
| 5,332,921 | A | | 7/1994 | Dousen et al. | |
| 7,176,057 | B2 | * | 2/2007 | Hable | ........................... 438/107 |
| 2005/0205970 | A1 | | 9/2005 | Chen et al. | |

FOREIGN PATENT DOCUMENTS
DE 102 14 953 A1 10/2003
WO WO 03/085738 A2 10/2003

* cited by examiner

*Primary Examiner* — Matthew Reames
(74) *Attorney, Agent, or Firm* — Slater & Matsil, L.L.P.

(57) ABSTRACT

A semiconductor module includes a module package including a first substrate having a first semiconductor device and a second substrate having a second semiconductor device. A first outer conductor extends from the module package and is connected to the first substrate and a second outer conductor extends from the module package and is connected to the second substrate. A method for producing the semiconductor module includes attaching first outer conductors of a leadframe to a first substrate, where the first substrate includes a first semiconductor device that is attached to the first substrate either before or after attaching the first outer conductors. A second substrate is provided including a signal processing circuit and the second substrate is fastening to second outer conductors of the leadframe.

7 Claims, 3 Drawing Sheets

SEMICONDUCTOR MODULE WITH AT LEAST TWO SUBSTRATES

PRIORITY CLAIM

This application claims priority to German Patent Application No. 102006056363.8 filed Nov. 29, 2006, the disclosure of which is incorporated by reference herein.

TECHNICAL FIELD

The invention relates to a semiconductor module and, in particular, a power module with at least two substrates.

BACKGROUND

In semiconductor modules, special substrates are used for the mounting of power devices, for example ceramic substrates which meet the special mechanical, electrical and thermal requirements of power electronics. To produce "intelligent" power modules, electronic circuits with a low power requirement, such as for example logic circuits, are increasingly being added to the power devices. For the integration of such electronics with low power consumption into the power module, a separate substrate may be used, one which is less expensive than the substrate required for the power electronics. When two substrates are used, however, questions arise regarding the arrangement of the substrates, their space requirement and their electrical and mechanical contacting in the module.

SUMMARY

According to a first aspect a module package includes a first substrate and a first semiconductor device on the first substrate. At least one first outer conductor extends from the module package and connects to the first substrate. A second substrate includes a second semiconductor device on the second substrate and at least one second outer conductor extends from the module package and connects to the second substrate.

According to a second aspect, a module package includes a first substrate including a power semiconductor. First outer conductors protrude from the module package and attached to the first substrate and are configured to supply load current to the power semiconductor. A second substrate includes a signal processing circuit. Second outer conductors protrude from the module package and fastening means is provided for fastening the second substrate to the second outer conductors.

According to a third aspect, a method for producing a semiconductor module includes attaching first outer conductors of a leadframe to a first substrate, where the first substrate includes a first semiconductor device that is attached to the first substrate either before or after attaching the first outer conductors. A second substrate is provided including a signal processing circuit and the second substrate is fastening to second outer conductors of the leadframe.

BRIEF DESCRIPTION OF THE DRAWING

The invention is explained in more detail below by way of example with reference to the drawings, in which.

DETAILED DESCRIPTION

Power modules which are additionally loaded with a signal processing circuit are described below. The signal processing circuit may serve for processing signals which control or monitor the function of the power semiconductor. For example, the signal processing circuit may be a sensor circuit or a control circuit or driver circuit. It may comprise analog and/or digital circuit portions and be configured for example as a logic circuit or amplifier circuit. Depending on the application, the circuit may include integrated circuits (i.e. semiconductor chips) or else passive devices and/or hybrid devices.

Figure 1:
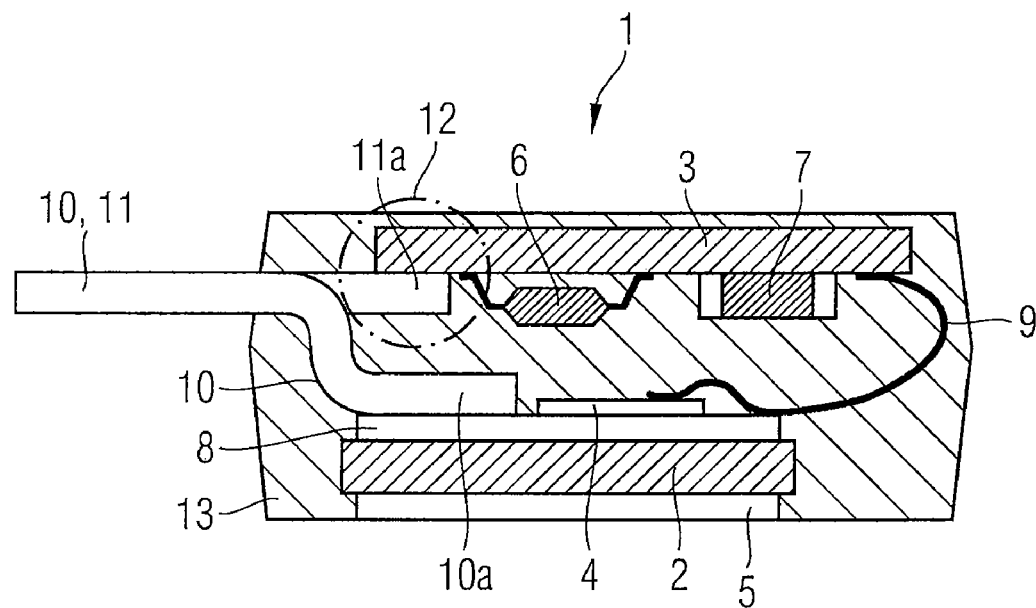
FIG. 1 is a schematic sectional view of a power module with two substrates according to a first exemplary embodiment.

FIG. 1 shows a power module 1, which includes a first substrate 2 and a second substrate 3. Applied to the first substrate 2 is a power semiconductor 4, for example an IGBT diode (Insulated Gate Bipolar Transistor). The second substrate 3 carries a signal processing circuit, which may for example comprise an integrated circuit 6 and a passive device 7. The integrated circuit may perform signal processing of any kind (for example signal generation, signal evaluation). The passive device 7 may be, for example, a resistor R, a capacitor C or an inductor L. The signal processing circuit implemented on the second substrate 3 has a lower power requirement than the power semiconductor 4.

DCB (Direct Copper Bonding) ceramic substrates are suitable for example for realizing the first substrate 2. These substrates may, for example, consist of aluminium oxide ceramic, to which a photopatternable copper layer 8 is applied. The copper layer 8 serves both for the electrical contacting of the power semiconductor 4 and for the dissipation of the heat generated in the power semiconductor 4. The power semiconductor 4 may be supplied with load current both via two bottom contacts and via one bottom contact and one top contact. A metallic bottom plate 5 may be provided and serve for the dissipation.

The second substrate 3 may be a conventional organic substrate, for example a glass-fibre-reinforced plastic substrate. Since there are typically much lower requirements with respect to heat dissipation and the cross section of the wiring paths with respect to the signal processing circuit, customary low-cost circuit boards can be used as the second substrate 3.

One or more electrically conducting connecting wires 9 realize a direct electrical connection between the power semiconductor 4, or wiring paths 8 on the first substrate 2 that are in electrical connection with the power semiconductor 4, and wiring paths on the second substrate 3.

The connecting wires 9 may for example consist of aluminium. They are expediently flexurally rigid, i.e. capable of keeping the loaded second substrate 3 in any desired bending position without further support. For example, a control signal for the power semiconductor 4 may be transmitted from the signal processing circuit 6, 7 to the power semiconductor 4 via the connecting wire or wires 9.

Flat outer conductors 10, 11, which electrically contact the conductor paths on the respective substrates 2, 3, are attached both to the first substrate 2 and to the second substrate 3. The flat outer conductors 10, 11 may represent contact leads of the module 1. They are for example component parts of a leadframe, which is used for the external contacting of the module 1.

Wiring paths realized by the patterned copper layer 8 on the first substrate 2 are contacted by first flat outer conductors 10. In the sectional representation, only one of these first flat outer conductors 10 can be seen. The first flat outer conductor 10 has a module-side end portion 10a, to which it is electrically and mechanically reliably connected, for example by means of an ultrasonic welding process, a laser welding process or soldering with the copper layer 8 on the first substrate 2. As it continues, the first flat outer conductor 10 may follow a stepped path in the form of two oppositely directed 90° bends, see FIG. 1.

In the example shown in FIG. 1, the second flat outer conductor 11 lies in the same plane as the first flat outer conductor 10. Since the second flat outer conductor 11 lies behind the first flat outer conductor 10 in the sectional representation, only its free end portion 11a can be seen uncovered in FIG. 1. There are in turn a plurality (for example more than 10) of second flat outer conductors 11, which are arranged distributed over the width of the module perpendicular to the plane of the paper. The end portion 11a of the second flat outer conductor 11 is fixed on the second substrate 3 by means of a fastening 12. The fastening 12 brings about both mechanically stable securement of the second substrate 3 on the side of the substrate opposite from the connecting wires 9 and electrical contacting of wiring paths on the second substrate 3 with respect to the second flat outer conductors 11.

A selective fastening, which may for example be adopted from "second-level assembly" technology, is preferably used as the fastening 12. Selective fastening means that the fastening operation does not take place together with the loading of the second substrate 3 with devices 6, 7 (customary "reflow soldering"), but can be carried out separately in the position and arrangement of the module components represented in FIG. 1.

A first exemplary embodiment of the fastening 12 is selective soldering. This may be achieved by an induction loop being arranged locally in the region of the fastenings 12 over the second substrate 3. By means of the induction loop, prefabricated solder depots, which have previously been applied to suitably arranged terminal areas of the second substrate 3, are melted and form a mechanically stable and electrically reliable soldered connection between the end portions 11a of the second flat outer conductors 11 and the second substrate 3.

A second exemplary embodiment for realizing the fastening 12 consists in producing a press-fit connection between the second flat outer conductor 11 and the second substrate 3. For this purpose, the second substrate 3 has metallized via holes at suitable points. Either an incompressible pin or a pin with flexible pressing-in zones is pressed into these metallized via holes. The procedure is known as "press-fit" technology in the area of "second-level assembly". By this "press-fit" technology, a mechanically stable and electrically reliable contact is achieved between the second flat outer conductor 11 and conductor paths of the second substrate 3.

If the fastening of the second substrate 3 to the second flat outer conductors 11 takes place by (selective) press-fit connections, the fastening points may be arranged anywhere, distributed over the second substrate 3. In the case of selective induction soldering, the fastening points are preferably chosen in linear arrangement, since the preferably simultaneous melting of all the solder depots for the contacting of the second flat outer conductors 11 is difficult or impossible in practice when the contacting locations are anywhere and the second substrate 3 is already loaded.

The first substrate 2 with the power semiconductor 4 and also the second substrate 3 with the signal processing circuit 6, 7 and the connecting wires 9 are embedded in a casting compound package 13. The first and second flat outer conductors 10, 11 may leave the casting compound package 13 while lying in one plane.

The contacting both of the first substrate 2 and of the second substrate 3 to contact leads or contact pins (first and second flat outer conductors 10, 11) of the module 1 achieves the effect of the current being carried directly from the contact leads (leadframe) both to the first substrate 2 and to the second substrate 3. It is not necessary to provide load current lines on the second substrate 3 for conducting load current for the power semiconductor 4 by way of the connecting wires 9, nor is it necessary to provide signal lines on the first substrate 2 by way of which the signal processing circuit 6, 7 on the second substrate 3 is connected to the contact leads (flat outer conductors), for example by means of the connecting wires 9. Avoiding load current being carried by way of the second substrate 3 increases the amount of space available on the second substrate 3, since no space has to be kept free for load current lines. Furthermore, finer patterns of the conductor paths can be produced by thinner copper. As a consequence, the second substrate 3 can be produced with smaller dimensions and lower cost in comparison with a situation in which load current is carried by way of the second substrate 3.

The avoidance of signalling lines running over the first substrate 2 as a result of the direct connection of the second substrate 3 to the flat outer conductors 11 makes a lower-cost configuration of the first substrate 2 possible. A further advantage of the direct connection of the second substrate 3 to the flat outer conductors 11 (leadframe) by means of the fastenings 12 is that it is possible to avoid signal delay problems, which may occur in the case of signalling lines running over the first substrate 2, for example in radio-frequency applications as a result of long signal line paths.

Figure 2:
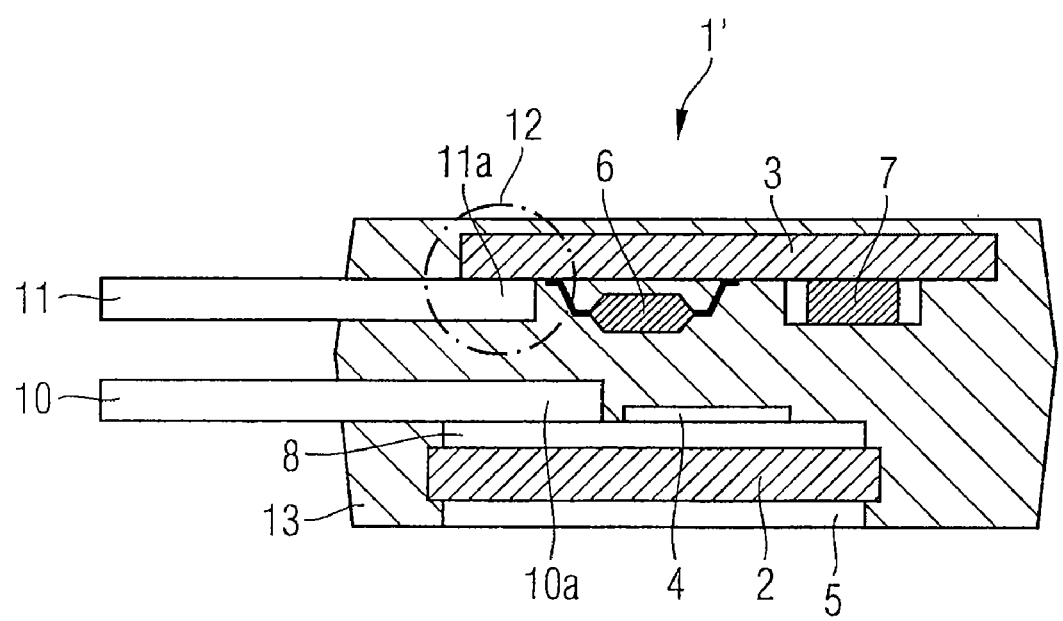
FIG. 2 is a schematic sectional view of a power module with two substrates according to a second exemplary embodiment.

FIG. 2 shows a further exemplary embodiment of a power module 1', in which the first and second flat outer conductors 10, 11 emerge from the casting compound package 13 in two planes with a vertical distance between them. In this case it is possible, according to FIG. 1, to dispense with the double bending of the first flat outer conductor 10. In the example shown in FIG. 2, for load current input the power semiconductor 4 is connected to the patterned copper layer 8 by means of bottom contacts, but it is also possible to use a power semiconductor 4 equipped with bottom and top contacts, with vertical load current flow. In particular for relatively great power outputs, power semiconductors 4 with vertical current flow are used. Identical or functionally similar parts are identified in FIGS. 1 and 2 by the same designations.

As can be seen from FIG. 2, it is also possible to dispense with the connecting wires 9. An external electrical connection between the first substrate 2 and the second substrate 3 may be realized by external wiring (not represented). It is also possible for neither an internal electrical connection nor an external electrical connection to be present between the first substrate 2 and the second substrate 3, for example if the signal processing circuit 6, 7 is a sensor, for example a temperature sensor.

Methods of producing the semiconductor module 1 are described below by way of example.

Figure 3:
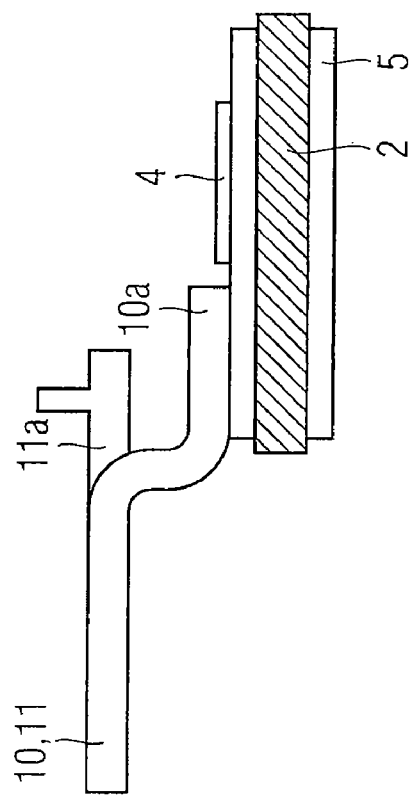
FIGS. 3-6 illustrate, in cross-section, process steps in accordance with an embodiment of the invention.

Firstly, as illustrated in FIG. 3, the leadframe with the first flat outer conductors 10 is attached to the first substrate 2. As already described, this may take place for example by means of an ultrasonic welding process.

Subsequently, the first substrate 2 is loaded with the power semiconductor 4. The loading preferably takes place after the attachment of the first flat outer conductors 10 to the first substrate 2, since the attachment step may possibly put the power semiconductor 4 at risk. In principle, however, it is also possible to load the first substrate 2 before the contacting by the first flat outer conductors 10.

Figure 4:
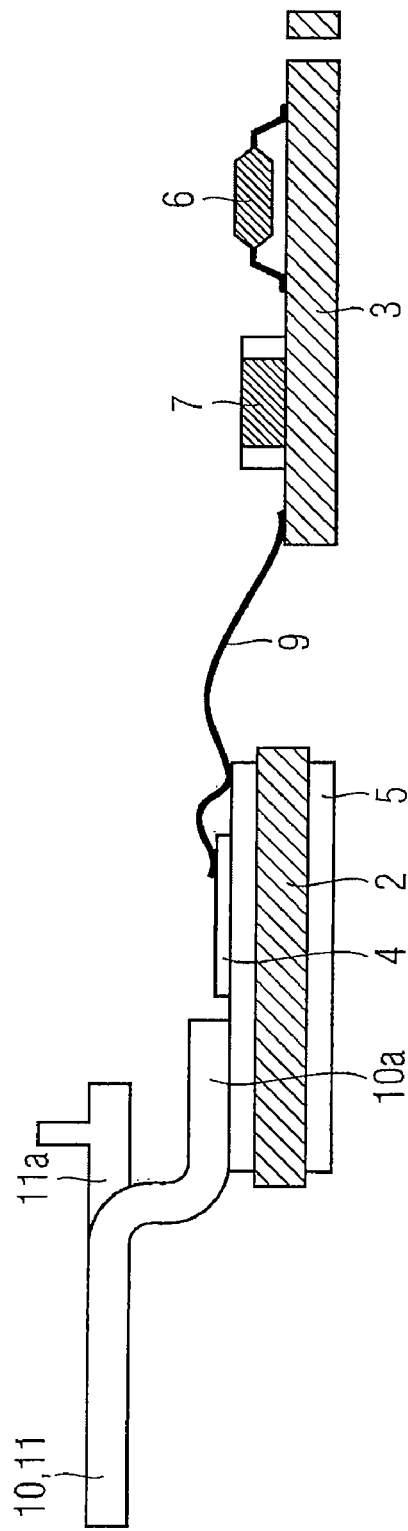

Subsequently, as illustrated in FIG. 4, the already loaded second substrate 3 is placed next to the first substrate 2. With respect to FIG. 1, the second substrate 3 would at this time be located to the right of the first substrate 2, represented in FIG. 1. In this arrangement, in the case of the exemplary embodiment according to FIG. 1 the connecting wires 9 are produced, for example in the form of aluminum wire-bond connections.

Figure 5:
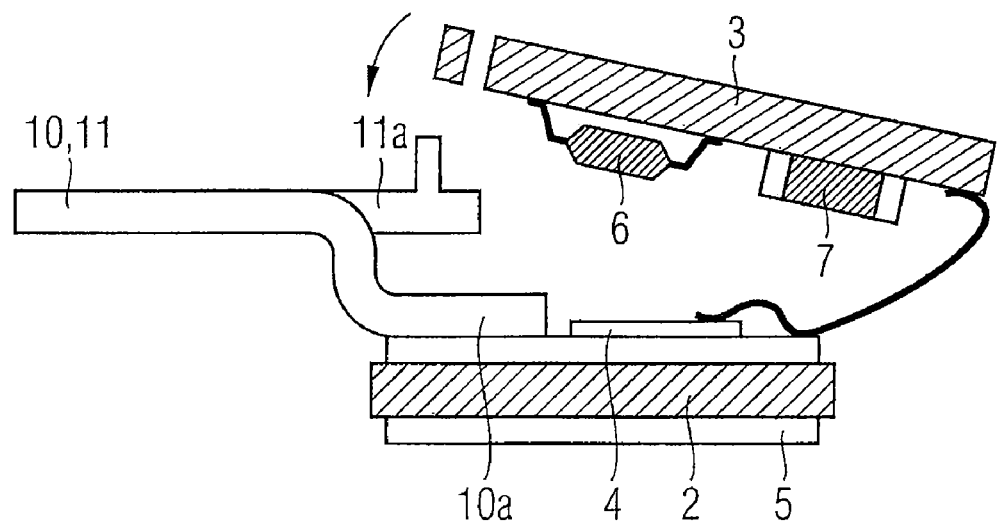

In the case of the exemplary embodiment according to FIG. 1, as illustrated in FIG. 5, the second substrate 3 is subsequently brought into the position of the first substrate 2 by a swinging movement. In this case, the connecting wires 9 may act as pivot bearings, if they have adequate mechanical load-bearing capacity and flexural rigidity. When resting on the free end portions 11a of the second flat outer conductors 11, the loaded second substrate 3 can be carried on the side supported by the connecting wires 9 by the connecting wires 9 alone.

If no connecting wires 9 are provided, see FIG. 2, the second substrate may be brought into the position represented in FIG. 2 and securely held there by means of a suitable handling device.

Figure 6:
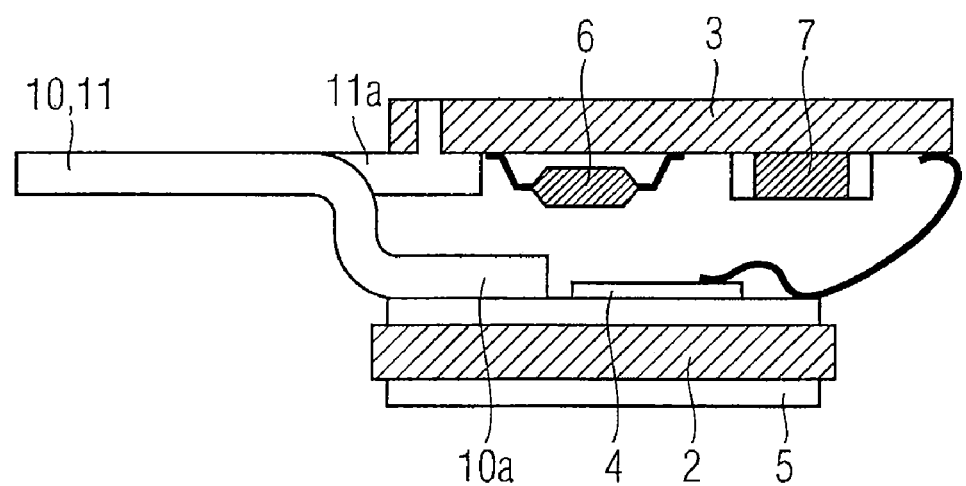

The second substrate 3 then lies with a peripheral portion on the end portions 11a of the second flat outer conductors 11, as illustrated in FIG. 6. There, the second substrate 3 is positionally adjusted with respect to the leadframe, pressed against the end portions 11a and fastened to the leadframe (i.e. the flat outer conductors 11) by means of one of the technologies already described (selective soldering, press-fit technology).

The flat outer conductors 11 and the fastenings 12 may be mechanically configured in such a way that they can carry the loaded second substrate 3 alone. If connecting wires 9 are present, they must therefore not be flexurally rigid or perform a supporting function.

After completion of the selective fastenings 12, the casting step for producing the casting compound package 13 ("mould compound") is performed. For this, the subassembly prefabricated in the way described is placed into a cavity of an injection mould and casting compound, for example polymer, is injected under pressure (for example 80 bar) into the cavity. As this happens, the subassembly is encapsulated with casting compound on all sides, possibly apart from the bottom plate 5 which serves for heat dissipation. The required positional stability of the second substrate 3 during the casting operation is ensured by the fastenings 12 and possibly by the support of the second substrate 3 that is provided by the connecting wires 9. In other words, the fastenings 12 between the leadframe and the second substrate 3 make it possible for casting to be performed without any damage and consequently increase the yield in the production process.

Instead of the casting compound package 13 being produced in an injection mould, the subassembly prefabricated in the way described may also be placed in a cavity package and the cavity package sealed by filling with a polymer, for example silicone compound.

The invention claimed is:

1. A method for producing a semiconductor module comprising:
    attaching first outer conductors of a leadframe to a first substrate, the first substrate including a first semiconductor device that is attached to the first substrate either before or after attaching the first outer conductors;
    providing a second substrate including a signal processing circuit; and
    positioning the second substrate over the first substrate by a swinging movement, such that the first semiconductor device and the signal processing circuit face each other, then fastening the second substrate to second outer conductors of the leadframe, wherein the fastening comprises producing press fits.

2. The method according to claim 1 further comprising electrically connecting the signal processing circuit to the second outer conductors while fastening the second substrate to the second outer conductors.

3. The method according to claim 1, wherein attaching first outer conductors to the first substrate comprises welding.

4. The method according to claim 1 further comprising electrically connecting the semiconductor device to the second substrate by means comprising line wires.

5. The method according to claim 1 further comprising embedding the first substrate and the second substrate in a casting compound.

6. The method according to claim 5, wherein embedding the first substrate and the second substrate in a casting compound comprises injecting casting a compound into a cavity of an injection mold.

7. The method according to claim 1, wherein positioning the first and second substrates one above the other comprises positioning the second substrate above the first substrate, and wherein fastening the second substrate to the second outer conductors of the leadframe further comprises positionally adjusting the second substrate with respect to the leadframe.

* * * * *